(12) United States Patent
Park

(10) Patent No.: US 9,007,840 B2
(45) Date of Patent: Apr. 14, 2015

(54) SEMICONDUCTOR MEMORY APPARATUS AND PROGRAM VERIFICATION METHOD

(75) Inventor: Young Soo Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 350 days.

(21) Appl. No.: 13/243,945

(22) Filed: Sep. 23, 2011

(65) Prior Publication Data

US 2012/0081970 A1    Apr. 5, 2012

(30) Foreign Application Priority Data

Sep. 30, 2010  (KR) .................. 10-2010-0095067

(51) Int. Cl.
  *G11C 16/04*    (2006.01)
  *G11C 16/10*    (2006.01)
  *G11C 16/34*    (2006.01)
(52) U.S. Cl.
  CPC ............ *G11C 16/10* (2013.01); *G11C 16/3454* (2013.01)
(58) Field of Classification Search
  CPC ....................................................... G11C 16/10
  See application file for complete search history.

(56) References Cited

U.S. PATENT DOCUMENTS

| 7,352,629 | B2 | 4/2008 | Chen | |
| 7,656,710 | B1 * | 2/2010 | Wong | 365/185.19 |
| 2008/0158966 | A1 * | 7/2008 | Chen et al. | 365/185.16 |
| 2009/0237993 | A1 * | 9/2009 | Yanagidaira et al. | 365/185.03 |

FOREIGN PATENT DOCUMENTS

KR    1020100057784 A    6/2010

* cited by examiner

*Primary Examiner* — Son Dinh
*Assistant Examiner* — Uyen B Tran
(74) *Attorney, Agent, or Firm* — William Park & Associates Patent Ltd

(57) ABSTRACT

A non-volatile memory apparatus includes a memory cell array, a power supply configured to generate an operation voltage according to an operation mode and provide the memory cell array with the operation voltage, and a controller configured to provide the memory cell array with a first verification voltage and a second verification voltage in a program verification operation, detect a high speed program cell by the first verification voltage and the second verification voltage from selected memory cells to be programmed and set the high speed program cell to be in a program inhibition state, and detect a low speed program cell by the second verification voltage.

8 Claims, 4 Drawing Sheets

SEMICONDUCTOR MEMORY APPARATUS AND PROGRAM VERIFICATION METHOD

CROSS-REFERENCES TO RELATED APPLICATION

The present application claims priority under 35 U.S.C. §119(a) to Korean application number 10-2010-0095067, filed on Sep. 30, 2010, in the Korean Intellectual Property Office, which is incorporated herein by reference in its entirety as set forth in full.

BACKGROUND

1. Technical Field

The present invention relates generally to a semiconductor memory apparatus, and more particularly, to a non-volatile memory apparatus and a verification method.

2. Related Art

A non-volatile memory apparatus such as a flash memory apparatus is being widely used for a computer, a memory card and the like. In addition, with broadening uses of a portable device such as a smartphone and a digital camera, the non-volatile memory apparatus is replacing a hard disk.

FIG. 1 is a configuration diagram of a known non-volatile memory apparatus.

As illustrated in FIG. 1, a non-volatile memory apparatus 10 includes a memory cell array 110, a page buffer unit 120, a Y decoder 130, an X decoder 140, a power supply 150, and a controller 160 for controlling operations of the non-volatile memory apparatus 10.

In the memory cell array 110, a plurality of memory cells storing data are electrically connected between word lines WL for selecting and activating memory cells and bit lines BL for inputting/outputting data of memory cells.

The page buffer unit 120 includes a plurality of page buffers electrically connected to the memory cell array 110 through the bit lines BL. Also, the page buffer unit 120 provides data to a selected memory cell of the memory cell array 110 in a program operation, or reads data from the selected memory cell of the memory cell array 110 in a read operation.

The Y decoder 130 provides data input/output paths to the page buffers of the page buffer unit 120 under the control of the controller 160, and the X decoder 140 selects the word lines WL of the memory cell array 110 under the control of the controller 160.

The power supply 150 generates an operation voltage according to an operation mode (program, erase and read modes) under the control of the controller 160, and supplies the generated operation voltage to the word lines WL or the page buffer unit 120 through the X decoder 140.

In the non-volatile memory apparatus, a program operation is generally performed using an incremental step pulse program (ISPP) scheme.

FIG. 2 is a diagram explaining a program method in the known non-volatile memory apparatus.

A program pulse Vpgm1 of a first step is applied to program selected memory cells. A verification voltage PVB is applied to the selected memory cells to verify whether a threshold voltage Vth of the memory cell become higher than the verification voltage PVB.

A program pulse Vpgm2 of a second step is applied to program memory cells which have not passed the program verification. At this time, the program pulse Vpgm2 is applied to all the memory cell coupled to a word line the program pulse Vpgm2 is applied, and thus the program pulse Vpgm2 is also applied to the memory cell which have passed the program verification. Nevertheless, memory cells which have passed the program verification are not programmed by making the memory cells a program inhibition state.

Similarly, after the program pulse Vpgm2 of the second step is applied to program the memory cells, the threshold voltages Vth of the memory cells are compared with the verification voltage PVB, i.e., the memory cells are verified as to whether a threshold voltage Vth of the memory cell become higher than the verification voltage PVB. Further, the program and verification operation is performed while gradually increasing (Vpgm3, Vpgm4, . . . ) the program pulse until all the memory cells are programmed.

If all memory cells to be programmed have the same program speed, the threshold voltages of the programmed memory cells have substantially the same distribution as that before the memory cells are programmed.

However, it is not possible for the memory cells to have the same program speed due to various reasons occurring in the process of fabricating the memory apparatus, a change in external conditions with the use of the memory apparatus, and the like. Therefore, in the program operation, there exist cells (high speed program cells) programmed at a high speed and cells (low speed program cells) programmed at a low speed. Further, the program operation may be completed when all the memory cells including the low speed program cells are programmed.

Although a difference exists in the program speed as described above, the program operation is performed by the same program pulse at the same time, and thus a threshold voltage distribution of a programmed memory cell has a certain width.

FIG. 3 is a diagram explaining threshold voltage distribution of cells in the known non-volatile memory apparatus.

It is assumed that memory cells with low threshold voltage levels CL0 are programmed and the threshold voltages of the memory cells move to high threshold voltage levels CL1.

The memory cells with the low threshold voltage levels CL0 include high speed program cells FC and low speed program cells SC, and the increases of the threshold voltages of the high speed program cells FC by a program pulse is larger than that of low speed program cells SC.

Further, since the program operation is completed when threshold voltages of all cells become higher than a verification voltage PVB, the threshold voltage distribution of the programmed memory cell has a certain width.

If the step voltage of the ISPP decreases, the width of the threshold voltage distribution may decrease. However, in this case, a program operation time may increase.

The width of the threshold voltage distribution of memory cells in the non-volatile memory apparatus is an important factor for determining a read margin. In this regard, various attempts are being made to reduce the width of the threshold voltage distribution.

SUMMARY

In an embodiment of the present invention, a non-volatile memory apparatus includes: a memory cell array; a power supply configured to generate an operation voltage according to an operation mode and provide the memory cell array with the operation voltage; and a controller configured to provide the memory cell array with a first verification voltage and a second verification voltage in a program verification operation, detect a high speed program cell by the first verification voltage and the second verification voltage from selected memory cells to be programmed and set the high speed program cell to be in a program prohibition state, and detect a low speed program cell by the second verification voltage.

In an embodiment of the present invention, a program verification method of a non-volatile memory apparatus, which programs selected memory cells of a memory cell array with a threshold voltage or more with a first level under a control of a controller, includes the steps of: applying a program pulse to program the selected memory cells, and detecting a high speed program cell by a first verification voltage and a second verification voltage, which is higher than the first level and lower than a level of the program pulse; and sequentially increasing the program pulse to program a memory cell, except for a cell detected as the high speed program cell from the selected memory cells, and performing a program verification operation by the second verification voltage.

BRIEF DESCRIPTION OF THE DRAWINGS

Features, aspects, and embodiments are described in conjunction with the attached drawings, in which.

DETAILED DESCRIPTION

Hereinafter, a non-volatile memory apparatus and a verification method thereof according to the present invention will be described in detail with reference to the accompanying drawings through exemplary embodiments.

Figure 1:
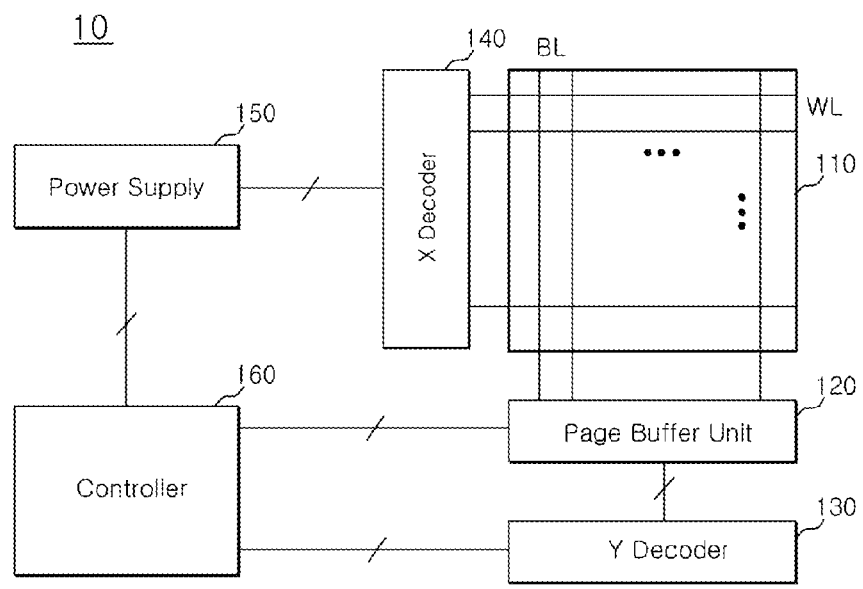
FIG. 1 is a configuration diagram of a known non-volatile memory apparatus.
Figure 2:
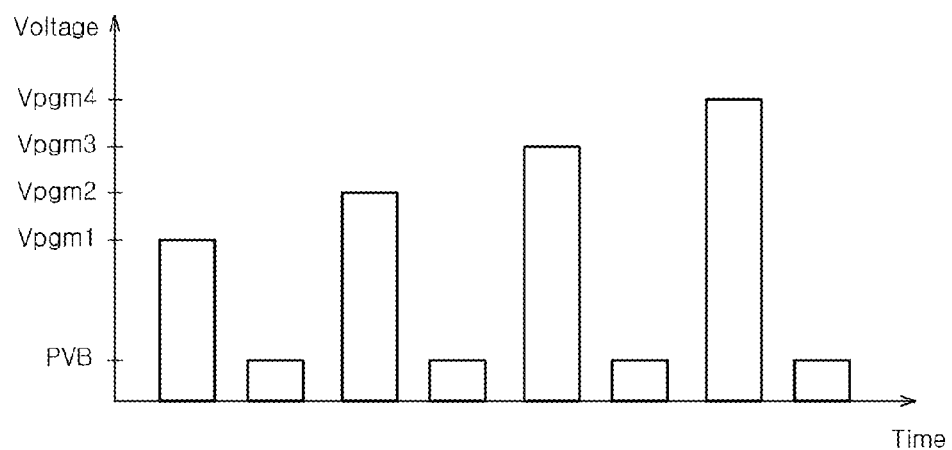
FIG. 2 is a diagram explaining a program method in a known non-volatile memory apparatus.
Figure 3:
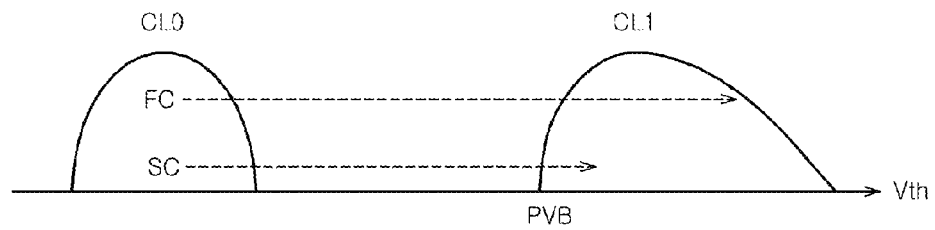
FIG. 3 is a diagram explaining threshold voltage distribution of cells in a known non-volatile memory apparatus.
Figure 4:
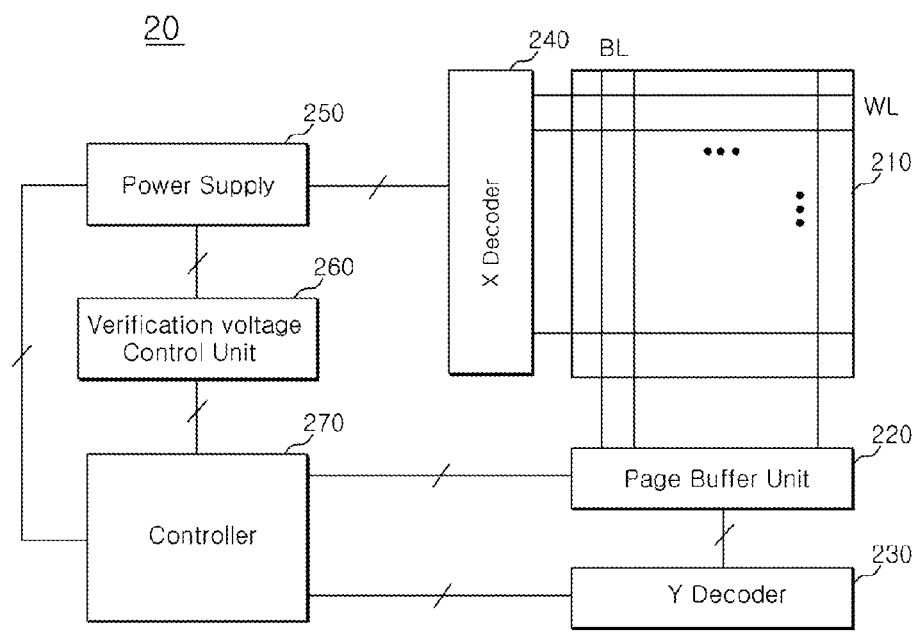
FIG. 4 is a configuration diagram of a non-volatile memory apparatus according to an embodiment.

FIG. 4 is a configuration diagram of a non-volatile memory apparatus according to an embodiment.

As illustrated in FIG. 4, a non-volatile memory apparatus 20 according to an embodiment includes a controller 270 for controlling the operation of the non-volatile memory apparatus 20, a memory cell array 210, a page buffer unit 220, a Y decoder 230, an X decoder 240, a power supply 250, and a verification voltage control unit 260.

In the memory cell array 210, a plurality of memory cells storing data are electrically connected between word lines WL for selecting and activating memory cells and bit lines BL for inputting/outputting data of memory cells.

The page buffer unit 220 includes a plurality of page buffers electrically connected to the memory cell array 210 through the bit lines BL. Also, the page buffer unit 220 provides data to a selected memory cell of the memory cell array 210 in a program operation, or reads data from the selected memory cell of the memory cell array 210 in a read operation.

The Y decoder 230 is configured to provide data input/output paths to the page buffers of the page buffer unit 220 under the control of the controller 270, and the X decoder 240 is configured to select the word lines WL of the memory cell array 210 under the control of the controller 270.

The power supply 250 is configured to generate an operation voltage according to an operation mode (program, erase and read modes) under the control of the controller 270, and supply the generated operation voltage to the word lines WL or the page buffer unit 220 through the X decoder 240.

The verification voltage control unit 260 is configured to control the output of the verification voltage from the power supply 250. According to an embodiment of present invention, a first verification voltage for detecting a high speed program cell, e.g., detecting whether at least one of the memory cells is programmed, and a second verification voltage for passing memory cells of which threshold voltage is higher than the second verification voltage but lower than the first verification voltage. In an embodiment, the verification voltage control unit 260 is arranged separately from the controller 270. However, the invention is not limited thereto. Therefore, the controller 270 may include the verification voltage control unit 260 and perform the functions of the verification voltage control unit 260.

Here, the program operation may be performed using an incremental step pulse program (ISPP) scheme, and the first verification voltage may be set to have a level which is higher than the second verification voltage and lower than a voltage of an initial program pulse.

The controller 270 checks whether at least one memory cell with a threshold voltage higher than the first verification voltage is detected from memory cells to be programmed.

When the at least one cell with the threshold voltage higher than the first verification voltage is detected, the controller 270 determines the corresponding cell as a programmed cell and sets the cell to be in a program inhibition state. In addition, the controller 270 detects memory cells with threshold voltages higher than the second verification voltage but lower than the first verification voltage, determines the corresponding cells as programmed cells, and sets the cells to be in the program inhibition state.

In such a state, when all memory cells are not programmed, a voltage of a program pulse is increased by a predetermined step and is applied to unprogrammed cells. The controller 270 performs a verification operation using the second verification voltage while increasing the program pulse until all the memory cells are programmed.

In another embodiment of the present invention, after detecting high speed program cells by the first verification voltage and thereby setting the high speed program cells to a program inhibition state, when applying the program pulse to the low speed program cells not completely programmed, a program pulse increasing rate is set to be greater than a program pulse increasing rate upon detecting the high speed program cells, as a result of which program for the unprogrammed cells may be implemented.

Due to this fact, a program speed for the low speed program cells may be increased, whereby it is possible to anticipate that not only cell distribution is improved but also a program speed is elevated.

Figure 5:
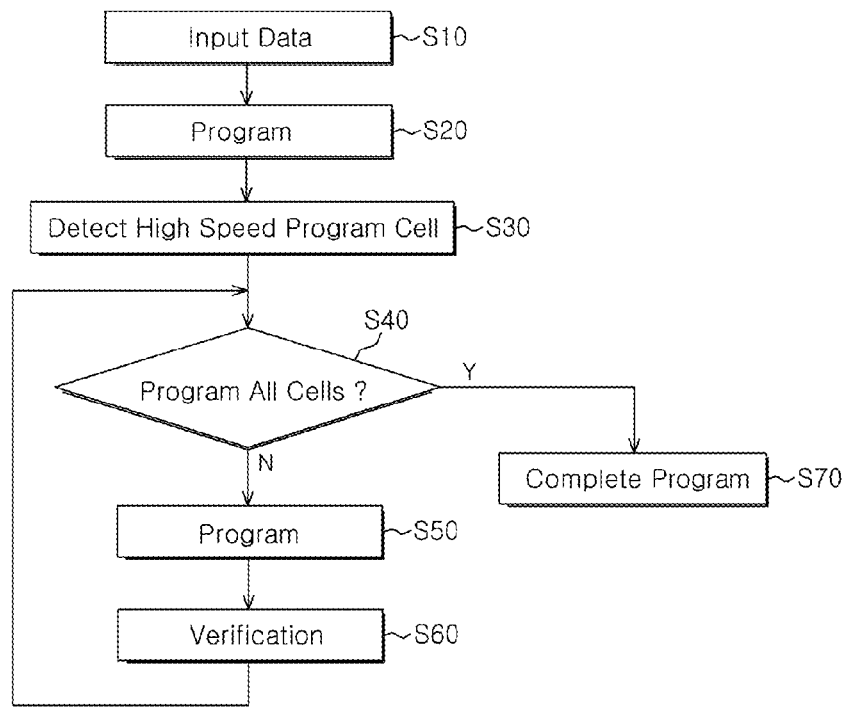
FIG. 5 is a flowchart explaining a program verification method of a non-volatile memory apparatus according to an embodiment.

FIG. 5 is a flowchart explaining a program verification method of the non-volatile memory apparatus according to an embodiment.

In the non-volatile memory apparatus, after data is input to the page buffer unit 220 (S10), the program operation and the program verification operation are performed. The program operation, using the ISPP scheme, begins (S20). After each program operation, the program verification program is performed. Further, a process for checking whether threshold voltages of all memory cells exceed a preset level is performed (S40).

In an embodiment, after data is input to the page buffer unit 220 (S10), the program operation is performed using the initial program pulse (S20), and the high speed program cells are detected using the first verification voltage (S30).

Figure 6:
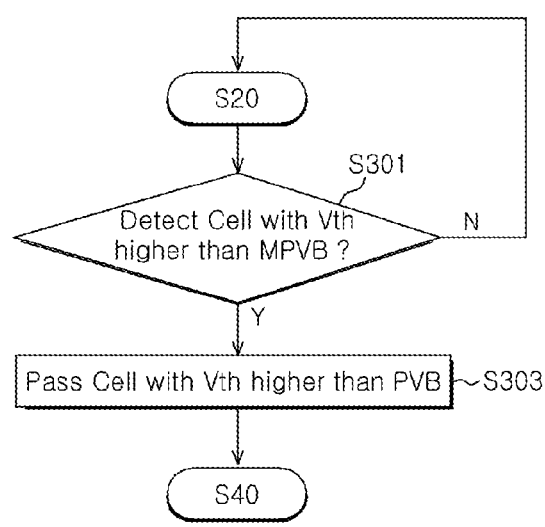
FIG. 6 is a flowchart explaining a high speed program cell detection process illustrated in FIG. 5.

FIG. 6 is a flowchart explaining a method for detecting the high speed program cells.

Referring to FIG. 6, whether at least one cell with a threshold voltage exceeding a first verification voltage MPVB is detected from cells programmed by the initial program pulse (S301). The level of the first verification voltage MPVB is set to be higher than the second verification voltage and lower than the level of the initial program pulse.

As a result of step S301, when the cell with the threshold voltage higher than the first verification voltage MPVB is not detected, the program pulse higher by the predetermined step is applied to perform the program operation again, and whether at least one cell with the threshold voltage exceeding the first verification voltage MPVB is detected from cells programmed by the initial program pulse (S301). After at least one cell with the threshold voltage higher than the first verification voltage MPVB is detected, cells of which threshold voltage is higher than the second verification voltage PVB but lower than the first verification voltage MPVB are set to be in a program inhibition state (S303).

As a result, cells with a high program speed can be detected through steps S301 and S303 and set in the program inhibition state.

Then, the controller 270 checks whether all selected cells have been programmed (S40), and if all selected cells have been programmed, the program operation is completed (S70).

If all selected cells have not been programmed, the program operation (S50) and the verification operation (S60) continue.

The program and verification process (S50, S60) after detecting the high speed program cells is repeated until the all selected cells are programmed.

Figure 7:
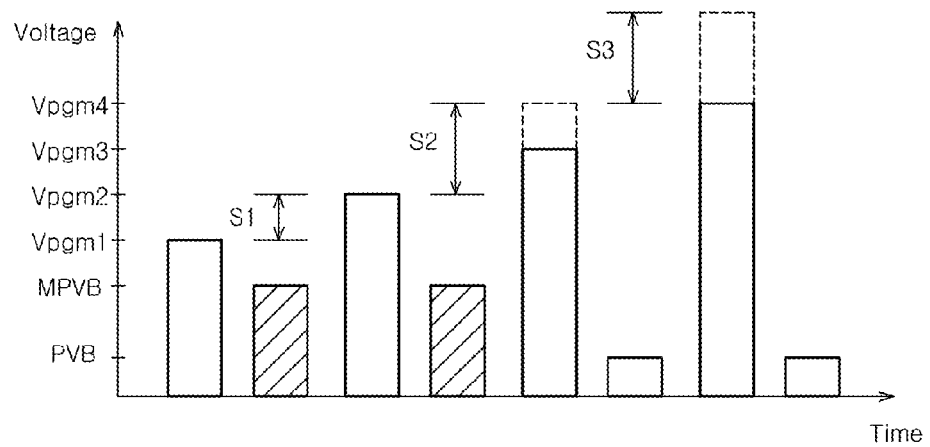
FIG. 7 is a conceptual diagram explaining a program verification method according to an embodiment.

FIG. 7 is a conceptual diagram explaining the program verification method according to an embodiment.

In an embodiment, in the program process using the ISPP scheme, the program verification process is performed using the first verification voltage MPVB higher than a target threshold voltage (e.g., the second verification voltage) of a cell and lower than a level Vpgm1 of the initial program pulse.

If at least one memory cell with a threshold voltage higher than the first verification voltage MPVB is detected, a memory cell with a threshold voltage higher than the second verification voltage PVB is set in the program inhibition state.

The verification process is performed with respect to unprogrammed cells using the second verification voltage PVB while increasing the program pulse, thereby allowing all cells to be programmed.

As aforementioned above, by setting a program pulse increasing rate (S2 and S3) when programming the unprogrammed cells to be greater than a program pulse increasing rate (S1) when detecting the high speed program cells, program for the unprogrammed cells may be implemented.

Due to this fact, a program speed for the low speed program cells may be increased, whereby it is possible to anticipate that not only cell distribution is improved but also a program speed is elevated.

Figure 8:
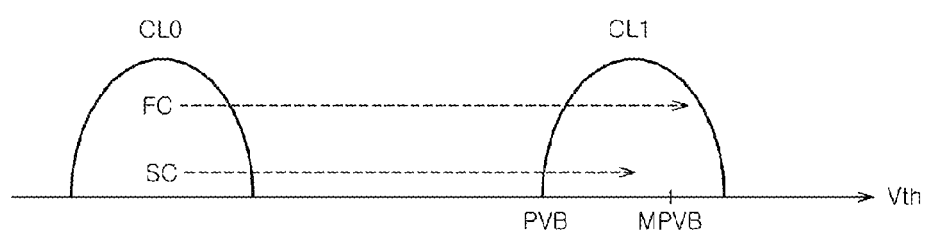
FIG. 8 is a diagram explaining threshold voltage distribution of cells using a program verification method according to an embodiment.

FIG. 8 is a diagram explaining threshold voltage distribution of cells using the program verification method according to an embodiment.

The high speed program cells are detected in advance and set in the program inhibition state, thereby achieving the uniform threshold voltage distribution of cells as illustrated in FIG. 8.

That is, as compared the known art, cells programmed at a high speed are detected in advance and set in the program inhibition state, thereby achieving the uniform threshold voltage distribution of cells.

Consequently, a read margin of the non-volatile memory apparatus may be improved, and a distribution margin of cell data and data retention characteristics may be improved.

So far, a verification process during a program process in the non-volatile memory apparatus has been described as an example. However, the invention is not limited thereto. That is, the invention can be applied to various verification processes such as a cache program verification process and a copy-back program verification process.

While certain embodiments have been described above, it will be understood to those skilled in the art that the embodiments described are by way of example only. Accordingly, the non-volatile memory apparatus and the verification method described herein should not be limited based on the described embodiments. Rather, the non-volatile memory apparatus and the verification method described herein should only be limited in light of the claims that follow when taken in conjunction with the above description and accompanying drawings.

What is claimed is:

1. A semiconductor memory apparatus comprising:
    a memory cell array;
    a power supply configured to generate an operation voltage according to an operation mode and provide the memory cell array with the operation voltage; and
    a controller configured to provide a first verification voltage and a second verification voltage to the memory cell array in a program verification operation, detect a high speed program cell with a threshold voltage higher than the first verification voltage or the second verification voltage among selected memory cells to be programmed when at least one memory cell having a threshold voltage higher than the first verification voltage is detected, and set the high speed program cell to be in a program inhibition state cell and complete a program mode for the program inhibition state cell,
    wherein the first verification voltage is higher than the second verification voltage, and
    wherein a program pulse is applied to unprogrammed cells except the program inhibition state cell among the selected memory cells.

2. The semiconductor memory apparatus according to claim 1, wherein the controller is configured to program the selected memory cells by sequentially increasing the program pulse, and when threshold voltages of the selected memory cells are programmed to be above the second verification voltage, the first verification voltage is higher than the second verification voltage and lower than a voltage level of an initial program pulse.

3. The semiconductor memory apparatus according to claim 1, wherein the controller is configured to perform a program operation by sequentially increasing the program pulse until threshold voltages of all memory cells not in the program inhibition state among the selected memory cells exceed the second verification voltage.

4. The semiconductor memory apparatus according to claim 1, wherein the controller is configured to perform a program operation by setting a program pulse increasing rate for all memory cells not in the program inhibition state among the selected memory cells to be greater than a program pulse increasing rate when performing a program operation using the first verification voltage.

5. A program verification method of a semiconductor memory apparatus that programs selected memory cells of a memory cell array with a threshold voltage or more with a second verification voltage under a control of a controller, comprising the steps of:
 applying a program pulse to program the selected memory cells, and detecting a high speed program cell by both of a first verification voltage and a second verification voltage, and setting the high speed program cell to be in a program inhibition state cell, and completing a program mode for the program inhibition state cell; and
 sequentially increasing the program pulse to program at least one memory cell, except for a cell detected as the high speed program cell from the selected memory cells, and performing a program verification operation by the second verification voltage,
 wherein detecting the high speed program cell is determining at least one memory cell with a threshold voltage higher than the first verification voltage or the second verification voltage when at least one memory cell having a threshold voltage higher than the first verification voltage is detected, and
 the first verification voltage is higher than the second verification voltage, and
 wherein the program pulse is applied to unprogrammed cells except the program inhibition state cell among the selected memory cells.

6. The program verification method according to claim 5, wherein, when any memory cell with the threshold voltage higher than the first verification voltage is not detected from the cells programmed by the program pulse, the program pulse is increased.

7. The program verification method according to claim 5, wherein, in the step of performing the program verification operation by the second verification voltage, whenever a program operation is performed by increasing a level of the program pulse, at least memory cell with a threshold voltage higher than the second verification voltage among the selected memory cells to be programmed is set in a program inhibition state.

8. The program verification method according to claim 7, wherein, when increasing the level of the program pulse, the program pulse is increased with a program pulse increasing rate greater than that when performing a program operation using the first verification voltage.

* * * * *